United States Patent
Wu et al.

(10) Patent No.: US 12,525,588 B2
(45) Date of Patent: Jan. 13, 2026

(54) MICRO LIGHT-EMITTING ASSEMBLY, MICRO LIGHT-EMITTING DEVICE MANUFACTURED FROM THE SAME AND METHOD FOR MASS TRANSFER OF MICRO LIGHT-EMITTING DEVICES

(71) Applicant: XIAMEN SAN'AN OPTOELECTRONICS TECHNOLOGY CO., LTD., Fujian (CN)

(72) Inventors: Zheng Wu, Fujian (CN); Boqi Zhan, Fujian (CN); Chia-En Lee, Funian (CN); Chen-Ke Hsu, Fujian (CN)

(73) Assignee: Hubei San'an Optoelectronics Co., Ltd., Hubei (CN)

( * ) Notice: Subject to any disclaimer, the term of this patent is extended or adjusted under 35 U.S.C. 154(b) by 821 days.

(21) Appl. No.: 17/448,539

(22) Filed: Sep. 23, 2021

(65) Prior Publication Data

US 2022/0005794 A1 Jan. 6, 2022

Related U.S. Application Data (63) Continuation-in-part of application No. PCT/CN2019/079577, filed on Mar. 25, 2019.

(51) Int. Cl.
*H01L 25/13* (2006.01)
*H10H 20/01* (2025.01)

(52) U.S. Cl.
CPC ........... *H01L 25/13* (2013.01); *H10H 20/018* (2025.01)

(58) Field of Classification Search
CPC . H01L 25/13; H01L 25/0753; H01L 21/6835; H01L 2221/68363;
(Continued)

(56) References Cited

U.S. PATENT DOCUMENTS 8,791,494 B2 * 7/2014 Jeong ............... H01L 33/06
257/99
11,063,073 B2 * 7/2021 Lee ............... H01L 21/6835
(Continued)

FOREIGN PATENT DOCUMENTS

CN 107818931 A * 3/2018 ........ H01L 21/67011
CN 108231968 A * 6/2018 ......... H01L 21/6835

OTHER PUBLICATIONS

Translation of CN 108231968 A, Wu et. al. from PE2E (Foreign/original version listed under foreign documents) (Year: 2018).*

(Continued)

*Primary Examiner* — Bitew A Dinke
(74) *Attorney, Agent, or Firm* — Thomas Horstsemeyer, LLP (57) ABSTRACT

A micro light-emitting assembly includes a base and at least one micro light-emitting device. The base contains a transitional substrate, a supporting layer disposed on the transitional substrate, and at least one supporting pillar having a bottom portion connected to the supporting layer and a top portion opposite to the bottom portion. The micro light-emitting device is supportively connected to the top portion of the supporting pillar. The micro light-emitting device has a recess-forming surface and a recess extending inwardly from the recess-forming surface to receive the top portion of the supporting pillar. A micro light-emitting device manufactured from the micro light-emitting assembly, and a method for mass transfer of micro light-emitting devices are also disclosed.

15 Claims, 10 Drawing Sheets

(58) Field of Classification Search
CPC ... H01L 2221/68386; H01L 2933/0033; H01L 2933/0025; H01L 33/486; H01L 33/0093; H01L 33/0095; H01L 33/44; H01L 33/48
See application file for complete search history.

(56) References Cited

U.S. PATENT DOCUMENTS

| | | | | |
|---|---|---|---|---|
| 2002/0081773 | A1* | 6/2002 | Inoue | H01L 33/32 257/E33.056 |
| 2012/0115262 | A1* | 5/2012 | Menard | H01L 31/048 29/829 |
| 2012/0299038 | A1* | 11/2012 | Hwang | H01L 33/641 257/E33.062 |
| 2013/0119424 | A1* | 5/2013 | Kang | H01L 33/50 257/98 |
| 2013/0130440 | A1* | 5/2013 | Hu | H01L 24/95 438/107 |
| 2013/0210194 | A1* | 8/2013 | Bibl | H01L 24/75 438/107 |
| 2013/0292719 | A1* | 11/2013 | Lee | H01L 27/156 257/93 |
| 2014/0363928 | A1* | 12/2014 | Hu | H01L 25/0753 438/125 |
| 2015/0179876 | A1* | 6/2015 | Hu | H01L 33/20 257/13 |
| 2015/0214420 | A1* | 7/2015 | Hu | H01L 33/32 438/28 |
| 2017/0047303 | A1* | 2/2017 | Meitl | H05K 3/3436 |
| 2018/0138071 | A1 | 5/2018 | Bower et al. | |
| 2018/0226287 | A1* | 8/2018 | Bower | H01L 33/0095 |
| 2018/0233496 | A1* | 8/2018 | Yoo | H01L 25/167 |
| 2020/0013648 | A1* | 1/2020 | Ahn | H01L 33/0095 |

OTHER PUBLICATIONS

International Search Report, International Patent Application PCT/CN2019/079577, mailed Dec. 25, 2019.
Search Report appended to an Office Action, which was issued to Chinese counterpart application No. 201980003930.3 by the CNIPA on Jan. 9, 2023, with an English translation thereof.

* cited by examiner

MICRO LIGHT-EMITTING ASSEMBLY, MICRO LIGHT-EMITTING DEVICE MANUFACTURED FROM THE SAME AND METHOD FOR MASS TRANSFER OF MICRO LIGHT-EMITTING DEVICES

CROSS-REFERENCE TO RELATED APPLICATION

This application is a continuation-in-part (CIP) application of PCT International Application No. PCT/CN2019/079577, filed on Mar. 25, 2019.

FIELD

The disclosure relates to a semiconductor component, and more particularly to a micro light-emitting assembly, a micro light-emitting device manufactured from the same, and a method for mass transfer of micro light-emitting devices.

BACKGROUND

A micro light-emitting diode (micro-LSD) has a potential to be a light source for next-generation displays, and is widely researched due to its advantages such as low power consumption, high luminance, ultra-high resolution, ultra-high color saturation, low response time, low energy consumption, and long lifetime, etc. In addition, the power consumption of a micro-LED display is about 10% of that of a liquid crystal display (LCD) and about 50% of that of an organic light-emitting diode (OLED) display. Furthermore, the luminance of the micro-LED display is 30 times higher than that of an OLED display, which is also a self-light-emitting device, and the resolution of the micro-LSD display can reach 1500 PPI (pixels per inch). Due to these outstanding qualities, the micro-LED is expected to replace the current OLED and LCD, thus becoming a light source for next-generation displays.

However, the micro-LED has yet to be subjected to mass production because there are still many technical difficulties to be overcomed, such as yield of mass transfer of the micro-LEDs.

For instance, the manufacturing of the micro-LEDs described in Chinese Invention Patent Application Publication No. CN107681034A (hereinafter referred to as the '034 application) involves use of thermosetting materials for making pillars that support the micro-LEDs, so that the micro-LEDs are in a state of ready to be picked up. Mass transfer of the micro-LEDs provided by the '034 application is performed by pressing using a stamp.

Figure 1:
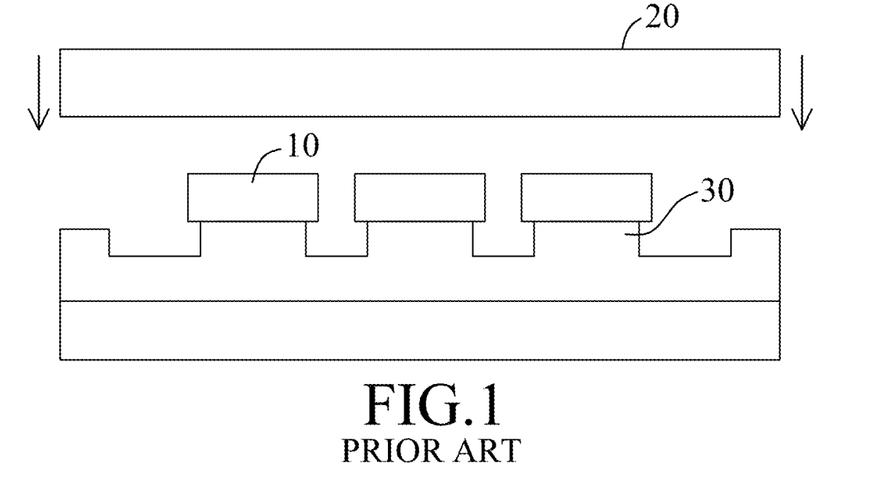
FIGS. 1 and 2 are schematic views illustrating mass transfer of conventional micro-LED devices.
Figure 2:
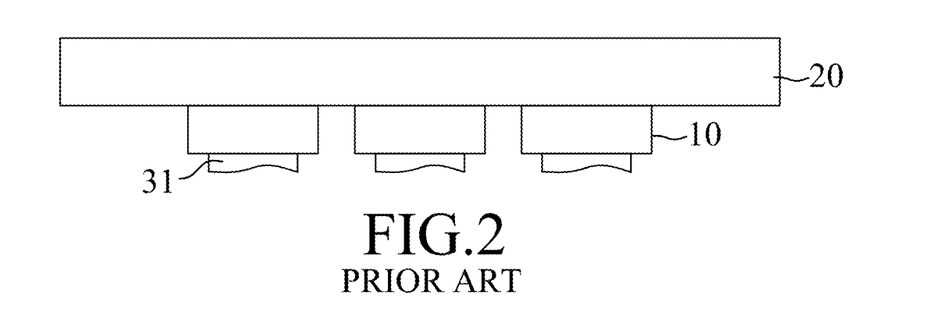

Referring to FIGS. 1 and 2, micro-LED devices 10 manufactured with reference to the '034 application have a configuration that is suitably applied to mass transfer of flip-chip LEDs. Each of the micro-LED devices 10 is supported by a pillar 30 made of the thermosetting material. Since the pillar 30 has an adhesion to a corresponding one of the micro-LED devices 10 that is higher than a fracture strength of the pillar 30 itself, a break of the pillar 30 occurs when the pillar 30 reaches its fracture strength under an external load. However, since the location of the break is uncontrollable, a pillar residue 31 left by the pillar 30 might remain on a surface of the corresponding micro-LED device 10. In some cases, the pillar residue 31 has an excessive height that is higher than electrodes of the corresponding micro-LED device 10, which would lead to failure in a subsequent die bonding process of the corresponding micro LED device 10, resulting in an adverse effect on the yield of the die bonding process.

SUMMARY

Therefore, an object of the disclosure is to provide a micro light-emitting assembly that can alleviate or eliminate at least one of the drawbacks of the prior art. A micro light-emitting device manufactured from the micro light-emitting assembly, and a method for mass transfer of micro light-emitting devices are also provided.

According to one aspect of the disclosure, a micro light-emitting assembly includes a base and at least one micro light-emitting device. The base contains a transitional substrate, a supporting layer disposed on the transitional substrate, and at least one supporting pillar having a bottom portion connected to the supporting layer and a top portion opposite to the bottom portion. The at least one micro light-emitting device is supportively connected to the top portion of the at least one supporting pillar, and has a recess-forming surface and a recess extending inwardly from the recess-forming surface to receive the top portion of the at least one supporting pillar.

According to another aspect of the disclosure, a micro light-emitting device manufactured from the abovementioned micro light-emitting assembly includes a micro light-emitting diode and a first intermediate layer. The micro light-emitting diode contains: a light-emitting epitaxial layer having a p-type cladding layer, an n-type cladding layer, and an active layer interposed between the p-type cladding layer and the n-type cladding layer; a p-type electrode connected to the p-type cladding layer; and an n-type electrode connected to the n-type cladding layer. The first intermediate layer is disposed on the light-emitting epitaxial layer to expose the p-type electrode and the n-type electrode, and is formed with the recess.

According to yet another aspect of the disclosure, a method for mass transfer of micro light-emitting devices includes: providing a growth substrate that has art upper surface having a first portion and a second portion; forming the micro light-emitting diodes that are spaced apart from each other on the first portion of the growth substrate to expose the second portion; disposing a first intermediate layer on the micro light-emitting diodes and the second portion of the growth substrate; disposing a sacrificial material on the first intermediate layer; forming a plurality of recesses that extend inwardly from the sacrificial material to the first intermediate layer and that terminate at the first intermediate layer; disposing a second intermediate layer at least in the recess; disposing a supporting layer on the second intermediate layer; providing a transitional substrate to bond with the supporting layer; lifting off the growth substrate; and removing the first intermediate layer that is disposed on the second portion of the growth substrate and the sacrificial material in such order.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

Embodiment 1

Figure 3:
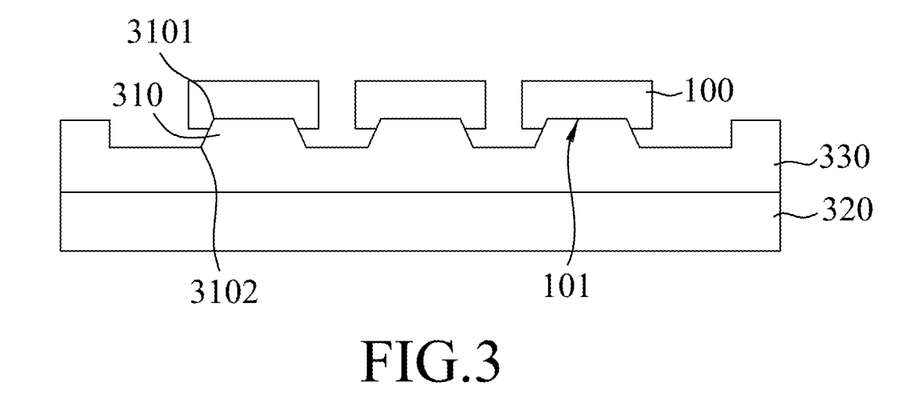
FIG. 3 is a schematic view illustrating a first embodiment of a micro light-emitting assembly of the disclosure.

Referring to FIG. 3, a first embodiment of a micro light-emitting assembly includes a base and at least one micro light-emitting device 100. The base includes a transitional substrate 320, a supporting layer 330 disposed on the transitional substrate 320, and at least one supporting pillar 310 having a bottom portion 3102 connected to the supporting layer 330 and a top portion 3101 opposite to the bottom portion 3102. The at least one micro light-emitting device 100 is supportively connected to the top portion 3101 of the at least one supporting pillar 310. The at least one micro light-emitting device 100 has a recess-forming surface and a recess 101 extending inwardly from the recess-forming surface to receive the top portion 3101 of the at least one supporting pillar 310. In this embodiment, the micro light-emitting assembly includes a plurality of the micro light-emitting devices 100 and a plurality of the supporting pillars 310. The micro light-emitting devices 100 are arranged in an array, and each of the supporting pillars 310 is connected to a corresponding one of the micro light-emitting devices 100.

For the convenience of description and easy understanding, only one of the supporting pillars 310 and the corresponding micro light-emitting device 100 are described hereinafter.

The micro light-emitting device 100 may be configured as a flip-chip structure, a face-up structure, or a vertical type structure.

In this embodiment, the recess-forming surface is located at a side opposite to a light-emitting side of the micro light-emitting device 100.

In this embodiment, the recess 101 has a bottom surface and a surrounding surface connected to the bottom surface. The top portion 3101 of the supporting pillar 310 abuts against the bottom surface and the surrounding surface of the recess 101.

The recess 101 has a depth ranging from 1000 Å to 2500 Å. In some embodiments, the recess 101 has a depth ranging from 1000 Å to 2000 Å.

In this embodiment, the transitional substrate 320 is made of sapphire, but is not limited thereto. Other materials such as glass and silicon may also be used to make the transitional substrate 320.

The supporting layer 330 and the supporting pillar 310 may be made of a polymer material, such as benzocyclobutene (BCB) resin.

In some embodiments, the supporting pillar 310 is formed in a shape of a cylinder. In some embodiments, the top portion 3101 of the supporting pillar 310 has a cross-section that varies from that of the bottom portion 3102.

In this embodiment, the supporting pillar 310 has a cross-section that gradually increases from the top portion 3101 to the bottom portion 3102, so that the supporting pillar 310 is formed in a shape of a boss. That is, a contact area of the top portion 3101 that is connected to the corresponding micro light-emitting device 100 is smaller than a contact area of the bottom portion 3102 that is connected to the supporting layer 330. Due to an adhesion in proportional to a contact area, under the premise of ensuring sufficient support of the supporting pillar 310 to the corresponding micro light-emitting device 100, the top portion 3101 of the supporting pillar 310 has a lower adhesion to the corresponding micro light-emitting device 100, but the supporting pillar 310 itself has a stronger fracture strength. The possibility of a break of the supporting pillar 320 occurring at an undesired position is reduced when the corresponding micro light-emitting device 100 is detached from the supporting pillar 310 in a subsequent mass transfer process. Therefore, a yield of the micro light-emitting devices 200 after the mass transfer and pick-up thereof can be improved.

Embodiment 2

Figure 4:
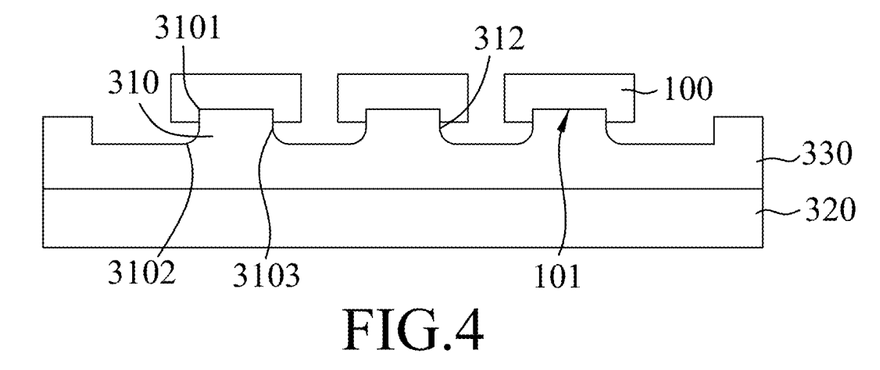
FIG. 4 is a schematic view illustrating a second embodiment of the micro light-emitting assembly of the disclosure.

Referring to FIG. 4, a second embodiment of the micro light-emitting assembly is similar to the first embodiment of the micro light-emitting assembly except that each of the supporting pillars 310 has a middle portion 3103 that is connected to the top portion 3101 and the bottom portion 3102. The middle portion 3103 of each of the supporting pillars 310 has a cross-section smaller than those of the top portion 3101 and the bottom portion 3102. In this embodiment, each of the middle portions 3103 serves as a stress-concentrated area 312. When each of the micro light-emitting devices 100 is detached from the corresponding supporting pillar 310 by applying a pressure on the micro light-emitting device 200 using a stamp, the pressure transmits from the micro light-emitting device 100 to the supporting pillar 310, and then a break of the supporting pillar 310 occurs at the stress-concentrated area 312.

Specifically, in this embodiment, for each of the supporting pillars 310, a distance from a center of the stress-concentrated area 312 to the corresponding micro light-emitting device 100 is designable and is smaller than a height of electrode(s) of the corresponding micro light-emitting device 100. A pillar residue, which remains in the recess 101 of the corresponding micro light-emitting device 100 after breaking of the supporting pillar 310, has a height lower than that of the electrode(s). Thus, the pillar residue of each of the supporting pillars 310 is ensured not to interfere with a eutectic bonding of the electrode(s) to a printed circuit board (PCB) during a subsequent die bonding process.

In a variant of the second embodiment of the micro light-emitting assembly, each of the supporting pillars 310 can be formed with defects such as a porous structure, and a distance between the porous structure and the corresponding micro light-emitting device 100 is adjustable, thereby achieving controllability of a breaking surface of the supporting pillar 310. The distance between the porous structure and the corresponding micro light-emitting device 100 is smaller than the height of the electrode(s) of the corresponding micro light-emitting device 100. A pillar residue, which remains in the recess 101 of the corresponding micro light-emitting device 100 after breaking of the supporting pillar 310, has a height lower than that of the electrode(s). Thus, the pillar residue of each of the supporting pillars 310 is ensured not to interfere with a eutectic bonding of the electrode(s) to the PCB during a subsequent die bonding process.

Embodiment 3

Figure 5:
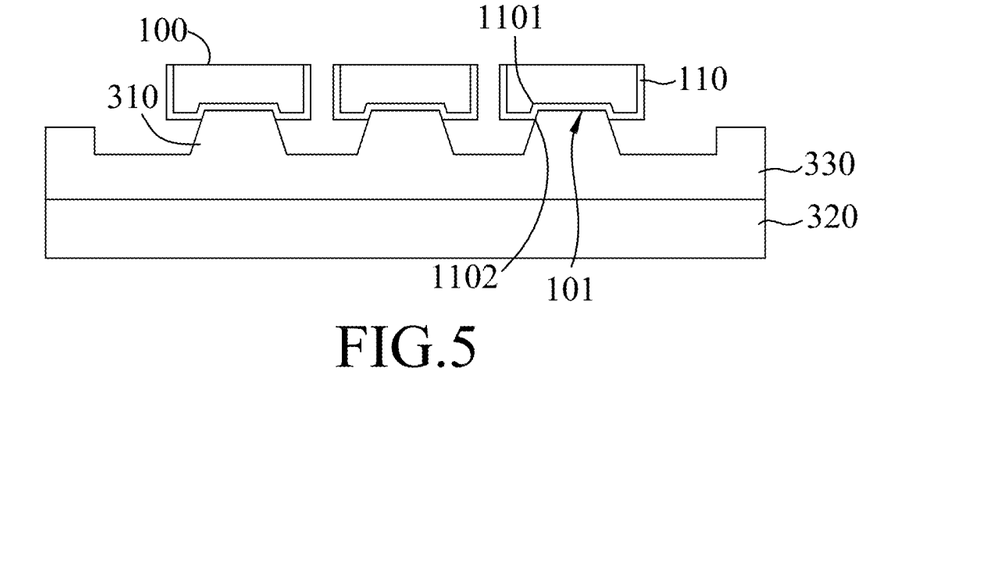
FIG. 5 is a schematic view illustrating a third embodiment of the micro light-emitting assembly of the disclosure.

Referring to FIG. 5, a third embodiment of the micro light-emitting assembly is similar to the first embodiment of the micro light-emitting assembly except that each of the micro light-emitting devices 100 includes a micro light-emitting diode and a first intermediate layer 110 interposed between the micro light-emitting diode and the supporting pillar 310.

In a mass transfer process of the micro light-emitting devices 100, an etching process is involved inevitably. Bubbles produced from a chemical reaction of the etching process will have a mechanical impact on the micro light-emitting diodes. Due to a gallium nitride-based material having a poor adhesion to a polymer material, the mechanical impact causes unexpected detachment of the micro light-emitting diodes from the supporting pillars 310 made of the polymer material.

Therefore, in this embodiment, the first intermediate layer 110 of each of the micro light-emitting devices 100 has an adhesion to the supporting pillar 310 that is higher than that of the light-emitting diode, so as to adequately ensure a sufficient connection between the light-emitting diode and the supporting pillar 310. In this embodiment, the micro light-emitting diode of each of the micro light-emitting devices 100 is made of a gallium nitride-based material, the supporting pillar 310 is made of the polymer material selected from a benzocyclobutene resin, a UV-sensitive resin and a photoresist, and the first intermediate layer 110 is made of a material selected from silicon dioxide, aluminium oxide, silicon nitride, and combinations thereof. Hence, the micro light-emitting diode of each of the micro light-emitting devices 100 is supportively connected to the supporting pillar. 310 through the first intermediate layer 110 in a stable manner.

Embodiment 4

Figure 6:
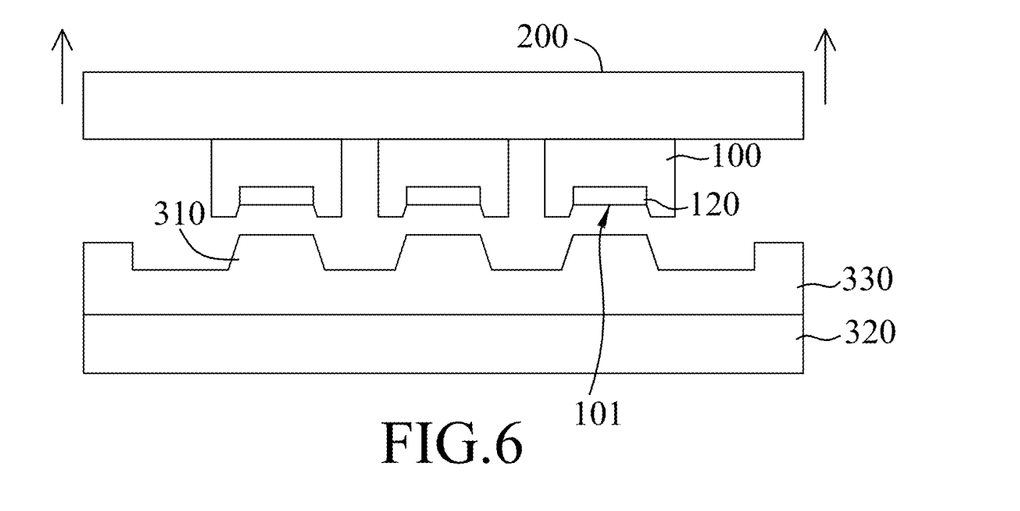
FIG. 6 is a schematic view illustrating a fourth embodiment of the micro light-emitting assembly of the disclosure.

Referring to FIG. 6, a fourth embodiment of the micro light-emitting assembly is similar to the first embodiment of the micro light-emitting assembly except that each of the micro light-emitting devices 100 includes a micro light-emitting diode and a second intermediate layer 120 that is interposed between the micro light-emitting diode and the supporting pillar 310.

In some embodiments, the second intermediate layer 120 serves as a sacrificial layer. The sacrificial layer is removed partially or entirely during the mass transfer process, so as to detach the micro light-emitting diode from the supporting pillar 310. A selective removal process may help to ensure that none of the supporting pillar 310 remains on the micro light-emitting diode. If any, only a little of a sacrificial material remains on a surface of the micro light-emitting diode. In this embodiment, the second intermediate layer 120 is made of a sacrificial material which is removable, and which is selected from a UV-sensitive resin, a photoresist, but is not limited thereto. Other removable materials such as silicon dioxide and titanium-tungsten alloys (TiW) may also be used to make the second intermediate layer 120.

Referring again to FIG. 6, a pressure is applied on each of the micro light-emitting devices 100 using a stamp 200 during the mass transfer process. The pressure on the micro light-emitting devices 100 results in the stamp 200 being adhered to the micro light-emitting devices 100. Then, the micro light-emitting devices 100 are picked up by the stamp 200 by adhering thereto, such as through Van der Waals force.

In this embodiment, an adhesion of the second intermediate layer 120 to the supporting pillar 310 of each of the micro light-emitting devices 100 is required to be smaller than an intermolecular force of the supporting pillar 310. Thus, the possibility of breaking of the supporting pillars 310 during detachment of the second intermediate layer 120 of each of the micro light-emitting devices 100 from the corresponding supporting pillar 310 is reduced.

Figure 7:
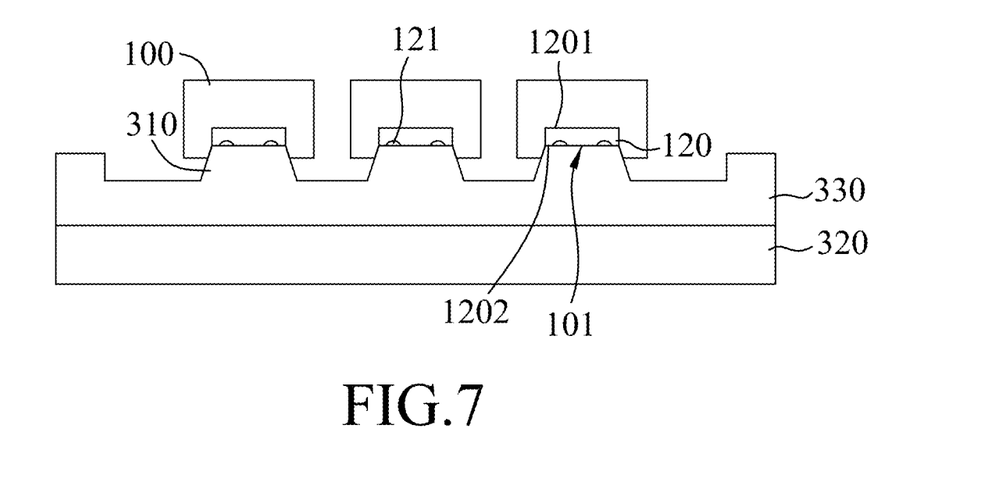
FIGS. 7 and 8 are schematic views illustrating variants of the fourth embodiment of the micro light-emitting assembly of the disclosure.

Referring to FIG. 7, in a first variant of the fourth embodiment of the micro light-emitting assembly, the second intermediate layer 120 of each of the micro light-emitting devices 100 has a first surface 1201 proximate to the micro light-emitting diode and a second surface 1202 that is opposite to the first surface 1201 and that is proximate to the corresponding supporting pillar 310. The second intermediate layer 120 has a porous structure 121 that may be formed at one of the first surface 1201, the second surface 1202, and a combination thereof. In this embodiment, the porous structure 121 is formed at the second surface 1202.

For each of the micro light-emitting devices 100, the porous structure 121 reduces a contact area between the second intermediate layer 120 and the supporting pillar 310, thereby reducing the difficulty of detaching the second intermediate layer 120 from the supporting pillar 310.

Similarly, the first intermediate layers 110 mentioned in the third embodiment can be formed with the porous structure 121. In certain embodiments, the first intermediate layer 110 of each of the micro light-emitting devices 100 has a first surface 1101 proximate to the micro light-emitting diode and a second surface 1102 that is opposite to the first surface and that is proximate to the corresponding supporting pillar 310. The second surface 1102 of the first intermediate layer 110 has the porous structure 121, thus reducing an adhesion of the first intermediate layer 110 to the corresponding supporting pillar 310.

Figure 8:
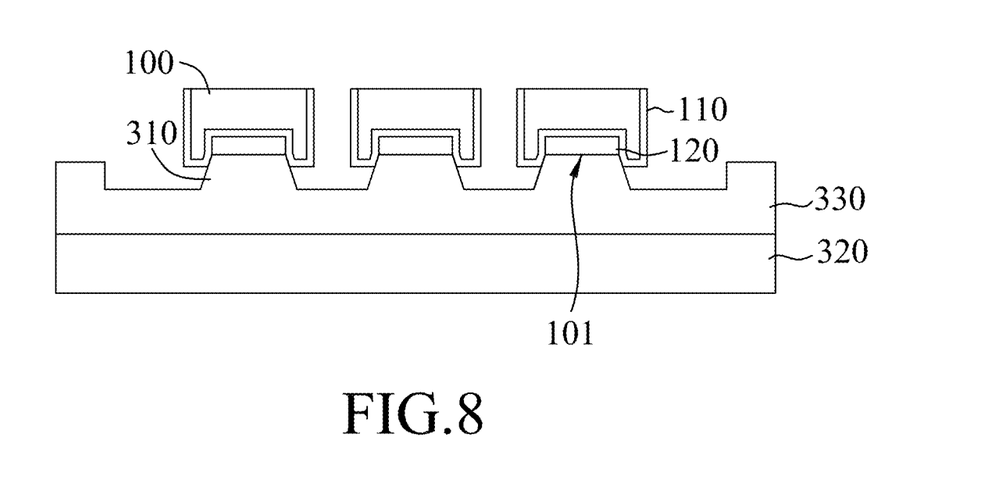

Referring to FIG. 8, in a second variant of the fourth embodiment of the micro light-emitting assembly, each of the micro light-emitting devices 100 further includes a first intermediate layer 110 interposed between the second intermediate layer 120 and the micro light-emitting diode. The second intermediate layer 120 has a good adhesion to the first intermediate layer 110.

In some embodiments, each of the first intermediate layers 110 is made of silicon dioxide and serves as a passivation layer, and each of the second intermediate layer 120 may be made of a material selected from chromium and titanium. Each of the second intermediate layer 120 has an adhesion to the corresponding supporting pillar 310 that is lower than that of each of the first intermediate layer 110, so that the corresponding supporting pillar 310 can be easily detached from the second intermediate layer 120 without breaking the supporting pillar 310 during the mass transfer process. Preferably, each of the micro light-emitting devices 100 has no pillar residues remaining thereon.

Embodiment 5

Figure 9:
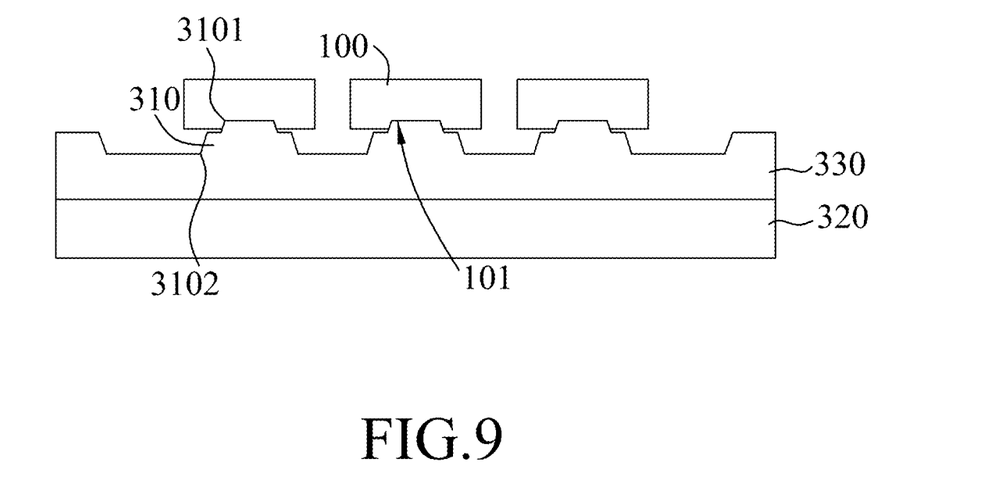
FIG. 9 is a schematic view illustrating a fifth embodiment of the micro light-emitting assembly of the disclosure.

Referring to FIG. 9, a fifth embodiment of the micro light-emitting assembly is similar to the first embodiment of the micro light-emitting assembly except for the following differences. Each of the top portion 3101 and the bottom portions 3102 of each of the supporting pillars 310 has a cross-section that increases from top to bottom, and a step is formed between the top portion 3101 and the bottom portion 3102 of each of the supporting pillars 310.

Referring to FIGS. 10 to 17, an embodiment of a method for mass transfer of the micro light-emitting devices 100 of the disclosure includes steps 1 to 11.

Figure 10:
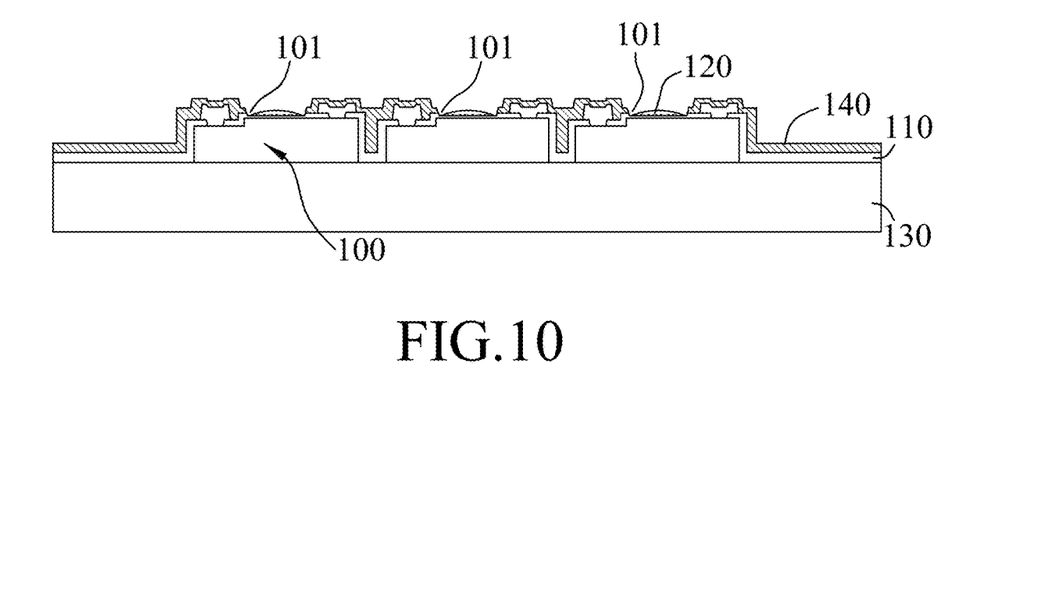
FIGS. 10 to 13 are schematic views illustrating an embodiment of a method for mass transfer of micro light-emitting devices through forming a micro light-emitting assembly having a base of the fifth embodiment in accordance with the disclosure.

Referring to FIG. 10, in step 1, a growth substrate 130 having an upper surface is provided, and the upper surface has a first portion and a second portion.

In step 2, a plurality of the micro light-emitting diodes spaced apart from each other are formed on the first portion of the growth substrate 130 by photolithography so as to expose the second portion. In this embodiment, the micro light-emitting diodes are flip-chip light-emitting diodes. In some embodiments, the micro light-emitting diode may be configured as a face-up light-emitting diode or a vertical light-emitting diode.

In step 3, the first intermediate layer 110 is disposed on the micro light-emitting diodes and the second portion of the growth substrate 130. In this embodiment, the first intermediate layer 110 serves as a passivation layer, and is made of a material selected from silicon dioxide, aluminium oxide, silicon nitride, and combinations thereof.

In step 4, a sacrificial material 140 is disposed on the first intermediate layer 110.

In step 5, a plurality of the recesses 101 that extend inwardly from the sacrificial material 140 to the first intermediate layer 110 and that terminate at the first intermediate layer 110 are formed. In this embodiment, each of the recesses 101 has a depth ranging from 1800 Å to 2300 Å. The recesses 101 are designed to have an optimized depth. The deeper the recesses 101 are, the stronger the adhesion of the micro light-emitting devices 100 to the supporting pillars 310 formed subsequently are. Hence, the recesses 101 that receive the supporting pillars 310 should not be too deep so as to prevent the supporting pillars 310 from breaking during the mass transfer process. Preferably, the recess 101 has a depth ranging from 1800 Å to 2000 Å.

In step 6, the second intermediate layer 120 is at least disposed in the recesses 101. In this embodiment, a portion of the second intermediate layer 120 is disposed in the recess 101. In this embodiment, the second intermediate layer 120 is thinner than the first intermediate layer 110. As shown in FIG. 10, the thickness of the portion of the second intermediate layer 120 disposed in the recess 101 is not drawn to scale. The second intermediate layer 120 is made of chromium or titanium.

Figure 11:
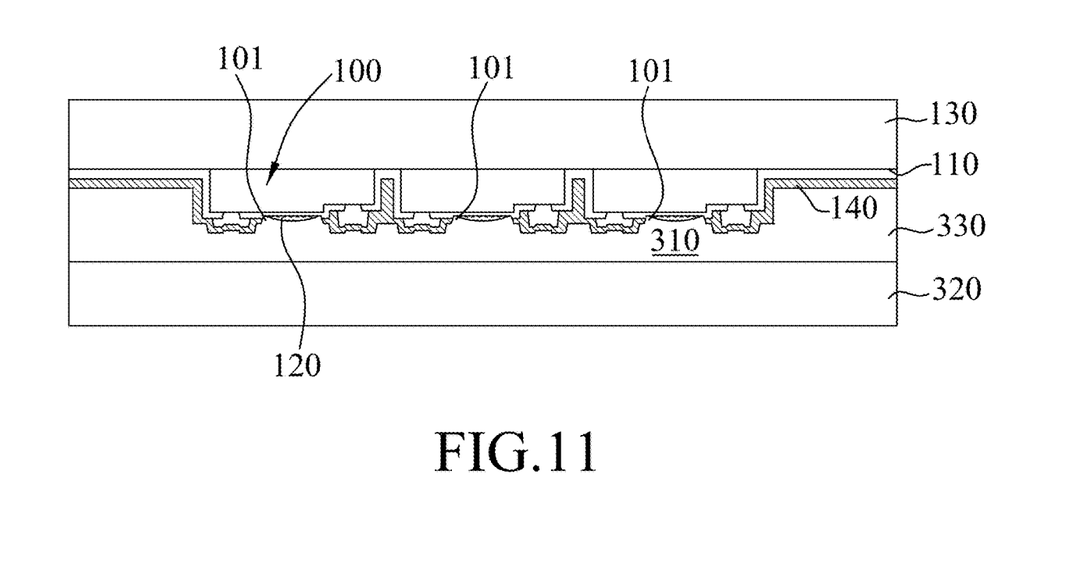

Referring to FIG. 11, in step 7, the supporting layer 330 is disposed on the second intermediate layer 120. The abovementioned supporting layer 330 is made of a polymer material that includes the benzocyclobutene resin, the UV-sensitive resin and the photoresist. The polymer material of the supporting layer 330 fills the recesses 101 to form the supporting pillars 310.

In step 8, the transitional substrate 320, which is spin-coated with a polymer material at a side to be bonded to the supporting layer 330, is provided to be bonded to the supporting layer 330. The polymer material used for coating the transitional substrate 320 is the same as that of the supporting layer 330. The transitional substrate 320 may be made of sapphire, silicon or glass.

Figure 12:
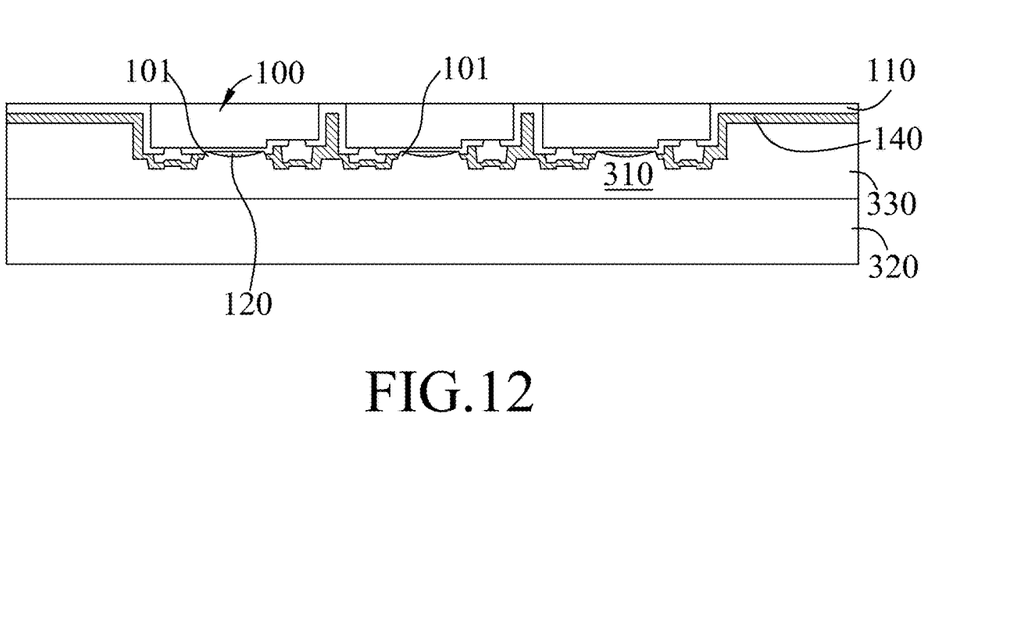

Referring to FIG. 12, in step 9, the growth substrate 130 is lifted off, for example, by laser lift-off, to expose the first intermediate layer 110 that is disposed on the second portion of the growth substrate 130 and the micro light-emitting diodes.

Figure 13:
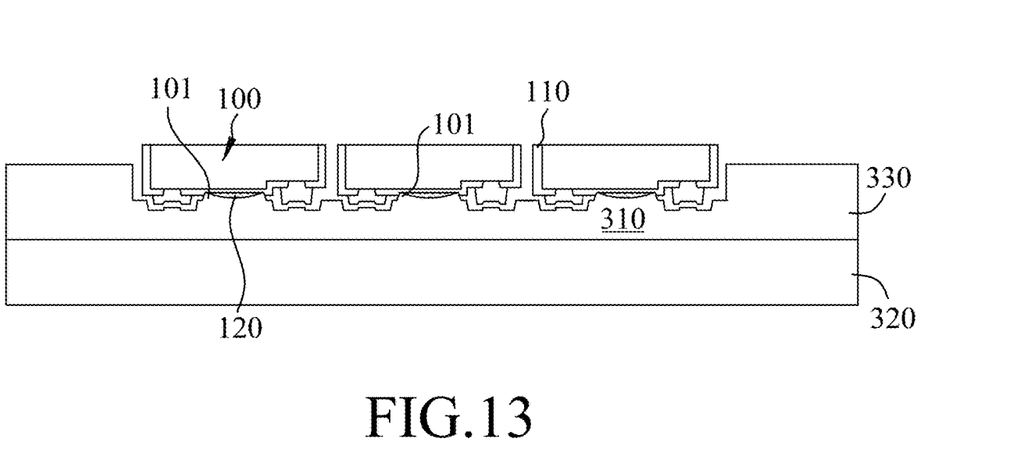
Figure 14:
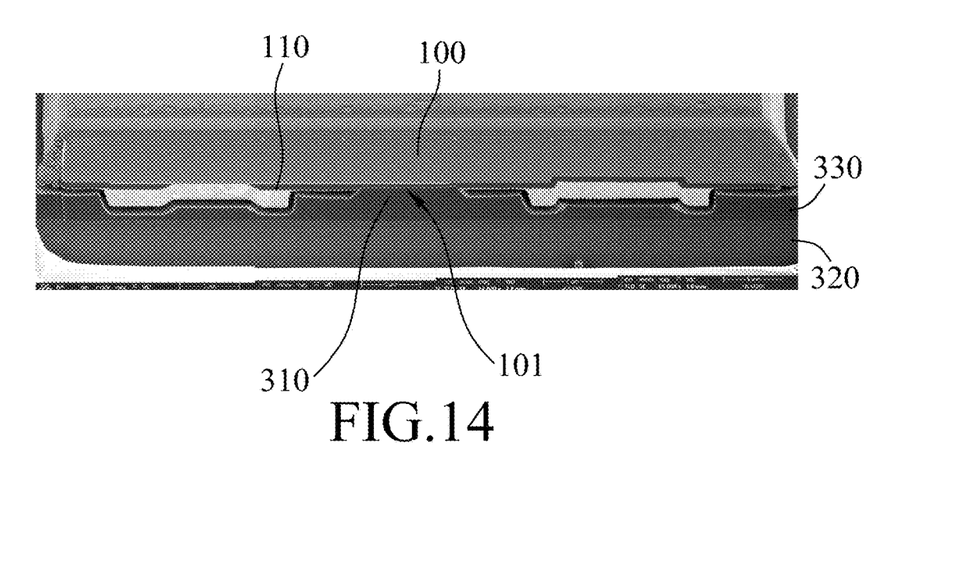
FIG. 14 is an image of the micro light-emitting assembly shown in FIG. 13.

Referring to FIG. 13, in step 10, the first intermediate layer 110 that is disposed on the second portion of the growth substrate 130, and the sacrificial material 140 that is disposed on the first intermediate layer 110 are removed in such order by one of dry etching and wet etching. In some embodiments, the second intermediate layer 120 on the sacrificial material 140 is also removed, while at least a portion of the second intermediate layer 120 remains in the recesses 101. Thereby, a plurality of the micro light-emitting diodes are independently supported on the supporting pillars 310 so as to form a micro light-emitting assembly having the base of the fifth embodiment, as shown in FIG. 14.

Figure 15:
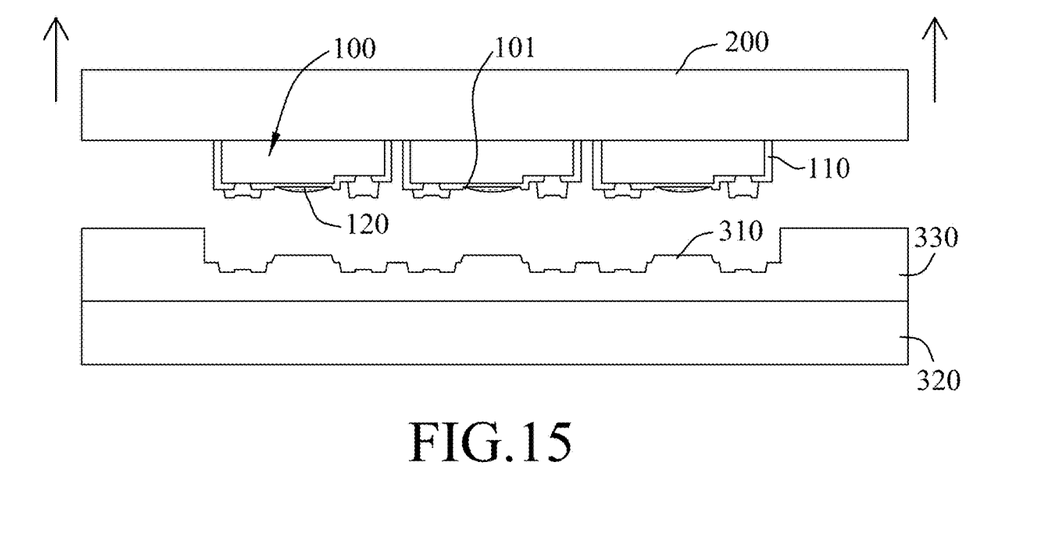
FIG. 15 is a schematic view illustrating the micro light-emitting devices that have been subjected to mass transfer.
Figure 16:
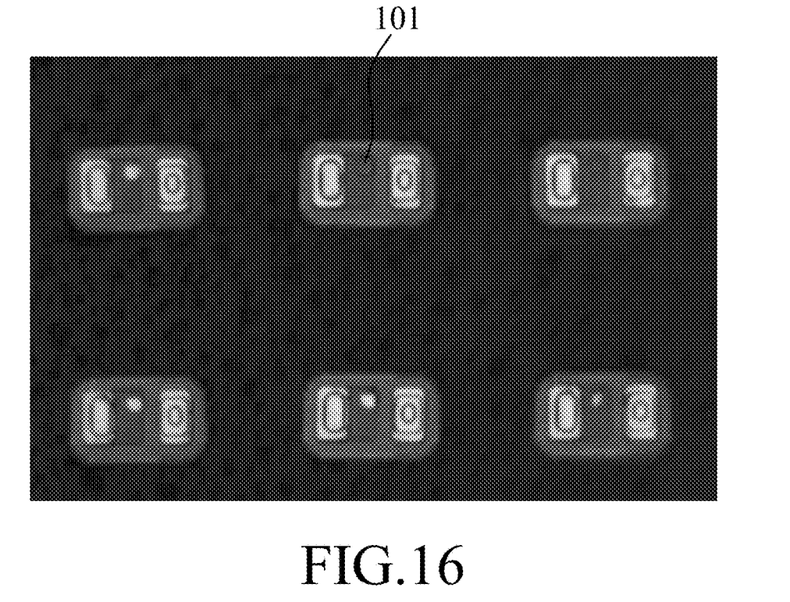
FIGS. 16 and 17 are top-view images of the micro light-emitting devices shown in FIG. 15.
Figure 17:
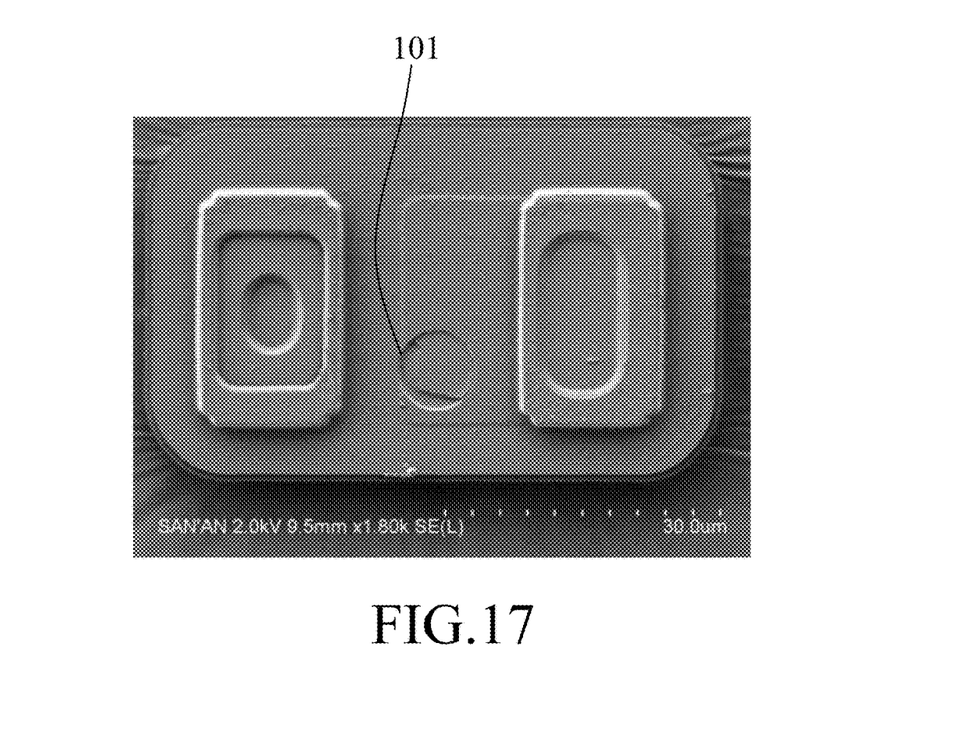

Referring to FIG. 15, in step 11, a side of each of the micro light-emitting devices 100 distal from the supporting layer 330 is pressed using a stamp 200 so as to separate the micro light-emitting devices 100 from the supporting layer 330. Referring to FIGS. 10 and 17, the thus separated micro light-emitting devices 100 are in a state to be picked-up.

Figure 18:
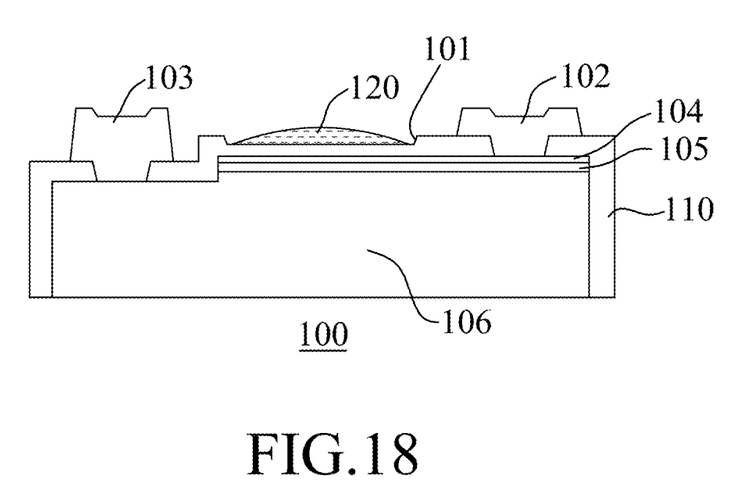
FIG. 18 is a schematic view illustrating an embodiment of the micro light-emitting device manufactured from the micro light-emitting assembly having the base of the fifth embodiment in accordance with the disclosure.

Referring to FIG. 18, one of the micro light-emitting devices 100 adapted to be mass transferred by the abovementioned method is described. The micro light-emitting devices 100 are manufactured from the micro light-emitting assembly having the base of the fifth embodiment.

The micro light-emitting device 100 includes the micro light-emitting diode and the first intermediate layer 110. The micro light-emitting diode includes a light-emitting epitaxial layer having a first surface and a second surface that is opposite to the first surface, a p-type electrode 102 and an n-type electrode 103. The light-emitting epitaxial layer has a p-type cladding layer 104, an n-type cladding layer 106, and an active layer 105 interposed between the p-type cladding layer 104 and the n-type cladding layer 106. The first intermediate layer 110 is disposed on the light-emitting epitaxial layer to expose the p-type electrode 102 and the n-type electrode 103, and the first intermediate layer 110 is formed with the recess 101.

In this embodiment, the n-type cladding layer 106 has a first elect rode-forming surface and a lower surface that is opposite to the first electrode-forming surface and that defines the second surface of the light-emitting epitaxial layer.

The active layer 105 is formed on the n-type cladding layer 106 to expose the first electrode-forming surface.

The p-type cladding layer 104 is formed on the active layer 105 and has a second electrode-forming surface opposite to the active layer 105. The first surface of the light-emitting epitaxial layer includes the first and second electrode-forming surfaces and a connecting surface interconnected therebetween.

The n-type electrode 103 is connected to the first electrode-forming surface of the n-type cladding layer 106.

The p-type electrode 102 is connected to the second electrode-forming surface of the p-type cladding layer 104.

The first intermediate layer 110 is disposed on the first surface of the light-emitting epitaxial layer to expose the p-type electrode 102 and the re-type electrode 103. The first intermediate layer 110 defines the recess-forming surface, and is formed with the recess 101.

The light-emitting diode includes a light-emitting side to emit light and an opposite side that is opposite to the light-emitting side. In some embodiments, the recess 101 is disposed on the opposite side opposite to the light-emitting side to avoid reduction of the light extraction efficiency. In the case that the micro light-emitting diode is a flip-chip light-emitting diode, the recess 101 is located at the same side as the p-type electrode 102 and the n-type electrode 103.

The recess 101 not only receives the supporting pillar 310 to transmit a supporting force from the supporting pillar 310, but also provides an adhesion to the supporting pillar 310.

Compared with the micro-LED device 100 having the recess 101 extending inwardly from a light-emitting epitaxial layer, in this embodiment, since the recess 101 is formed by extending inwardly from an outer surface of the first intermediate layer 210, the micro light-emitting device 200 has an improved adhesion to the supporting pillar 310 due to the first intermediate layer 110 having an adhesion to the supporting pillar. 310 that is higher than that of the light-emitting epitaxial layer. As mentioned above, the first intermediate layer 110 may be made of the material selected from silicon dioxide, aluminium oxide, silicon nitride, and combinations thereof, and the supporting pillar 310 may be made of the polymer material selected from benzocyclobutene resin UV-sensitive resin and photoresist.

In this embodiment the recess 101 has an opening converging inwardly from the outer surface of the first intermediate layer 110. As mentioned above, the depth of the recess 101 ranges from 1000 Å to 2500 Å. Preferably the depth of the recess 101 ranges from 1800 Å to 2000 Å.

As mentioned above, the second intermediate layer 120 has an adhesion to the supporting pillar 310 that is smaller than an intermolecular force of the supporting pillar 310. As mentioned above, the second intermediate layer 120 is made of chromium or titanium. As mentioned above the first surface 1201 of the second intermediate layer 120 is proximate to the micro light-emitting diode, and the second surface 1202 of the second intermediate layer 120 is opposite to the first, surface 1201 and is proximate to the supporting pillar 310. The second intermediate layer 120 may have the porous structure 121 formed at one of the first surface 1201, the second surface 1202 and a combination thereof.

In this embodiment, the second intermediate layer 120 is disposed at least in the recess 101 and has a height lower than those of the p-type electrode 102 and the n-type electrode 103. Thus, detachment of the micro light-emitting device 100 from the supporting pillar 310 without breaking the supporting pillar 310 is ensured, as shown in FIGS. 16 and 17.

In some embodiments, the pillar residue may inevitably remain in the recess 101. The pillar residue will have a height lower than those of the p-type electrode 102 and the n-type electrode 103.

In the description above, for the purposes of explanation, numerous specific details have been set forth in order to provide a thorough understanding of the embodiments. It will be apparent, however, to one skilled in the art, that, one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A micro light-emitting assembly comprising:
    a base including a transitional substrate, a supporting layer disposed on said transitional substrate, and at least one supporting pillar having a bottom portion connected to said supporting layer and a top portion opposite to said bottom portion; and
    at least one micro light-emitting device supportively connected to said top portion of said at least one supporting pillar, said at least one micro light-emitting device having a recess-forming surface and a recess extending inwardly from said recess-forming surface to receive said top portion of said at least one supporting pillar;
    wherein said at least one micro light-emitting device includes a micro light-emitting diode and a first intermediate layer interposed between said micro light-emitting diode and said at least one supporting pillar; and
    wherein said first intermediate layer is made of a material selected from silicon dioxide, aluminium oxide, silicon nitride, and combinations thereof; and
    wherein said first intermediate layer has an adhesion to said at least one supporting pillar that is higher than that of said light-emitting diode;
    wherein said at least one micro light-emitting device further includes a second intermediate layer interposed between said first intermediate layer and said at least one supporting pillar; and
    wherein said second intermediate layer has a porous structure.

2. The micro light-emitting assembly of claim 1, wherein said recess has a bottom surface and a surrounding surface connected to said bottom surface, said top portion of said at least one supporting pillar abutting against said bottom surface and said surrounding surface.

3. The micro light-emitting assembly of claim 1, wherein said recess has a depth ranging from 1000 Å to 2500 Å.

4. The micro light-emitting assembly of claim 1, wherein said recess has a depth ranging from 1800 Å to 2000 Å.

5. The micro light-emitting assembly of claim 1, wherein said at least one supporting pillar is formed in a shape of a cylinder or a boss.

6. The micro light-emitting assembly of claim 1, wherein said at least one supporting pillar has a cross-section that gradually increases from said top portion to said bottom portion.

7. The micro light-emitting assembly of claim 1, wherein in said at least one supporting pillar, each of said top portion and said bottom portions has a cross-section that increases from top to bottom, a step being formed between said top portion and said bottom portion.

8. The micro light-emitting assembly of claim 1, wherein said at least one supporting pillar has a middle portion that is connected to said top and bottom portions, said middle portion having a cross-section smaller than those of said top and bottom portions and serving as a stress-concentrated area.

9. The micro light-emitting assembly of claim 1, wherein said supporting pillar is made of a polymer material selected from a benzocyclobutene resin, a UV-sensitive resin and a photoresist.

10. The micro light-emitting assembly of claim 1, wherein said first intermediate layer has a first surface proximate to said micro light-emitting diode and a second surface that is opposite to said first surface and that is proximate to said at least one supporting pillar, said second surface of said first intermediate layer having a porous structure.

11. The micro light-emitting assembly of claim 1, wherein, said second intermediate layer having an adhesion to said at least one supporting pillar that is smaller than an intermolecular force of said at least one supporting pillar.

12. The micro light-emitting assembly of claim 11, wherein said second intermediate layer has a first surface proximate to said micro light-emitting diode and a second surface that is opposite to said first surface and that is proximate to said at least one supporting pillar, said porous structure of said second intermediate layer being formed at one of said first surface of said second intermediate layer, said second surface of said second intermediate layer, and a combination thereof.

13. The micro light-emitting assembly of claim 11, wherein said second intermediate layer is made of chromium or titanium.

14. The micro light-emitting assembly of claim 11, wherein said second intermediate layer is made of a removable material selected from a UV-sensitive resin, a photoresist, silicon dioxide and titanium-tungsten alloys.

15. The micro light-emitting assembly of claim 1, wherein said recess-forming surface is located at a side opposite to a light-emitting side of the micro light-emitting device.

* * * * *